(12) United States Patent
Mikami (10) Patent No.: US 9,653,321 B2
(45) Date of Patent: May 16, 2017

(54) PLASMA PROCESSING METHOD

(71) Applicant: Tokyo Electron Limited, Tokyo (JP)

(72) Inventor: Shunichi Mikami, Hsin-chu (TW)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/507,882

(22) Filed: Oct. 7, 2014

(65) Prior Publication Data
US 2015/0104950 A1 Apr. 16, 2015

(30) Foreign Application Priority Data
Oct. 15, 2013 (JP) ................................ 2013-214780

(51) Int. Cl.
| | |
|---|---|
| H01L 21/3213 | (2006.01) |
| H01L 21/311 | (2006.01) |
| H01L 21/02 | (2006.01) |

(52) U.S. Cl.
CPC .... *H01L 21/32139* (2013.01); *H01L 21/0206* (2013.01); *H01L 21/02071* (2013.01); *H01L 21/31116* (2013.01); *H01L 21/31144* (2013.01); *H01L 21/32136* (2013.01); *H01L 21/32137* (2013.01)

(58) Field of Classification Search
None
See application file for complete search history.

(56) References Cited

U.S. PATENT DOCUMENTS

| | | | | |
|---|---|---|---|---|
| 4,465,552 | A * | 8/1984 | Bobbio et al. ................ 438/722 |
| 5,777,370 | A * | 7/1998 | Omid-Zohoor ... H01L 21/76237 257/372 |
| 5,849,136 | A * | 12/1998 | Mintz ............... H01J 37/32183 118/723 E |
| 6,008,139 | A * | 12/1999 | Pan ................... H01J 37/32091 257/E21.312 |
| 6,207,565 | B1 * | 3/2001 | Yeh et al. ..................... 438/669 |
| 2001/0028093 | A1 * | 10/2001 | Yamazaki ......... H01L 21/02071 257/412 |
| 2004/0157385 | A1 * | 8/2004 | Ikezawa ............ H01L 21/28035 438/197 |
| 2005/0032386 | A1 * | 2/2005 | Chang .............. H01L 21/82382 438/712 |
| 2005/0196967 | A1 * | 9/2005 | Savas et al. .................. 438/700 |
| 2009/0000640 | A1 | 1/2009 | Aoki et al. |

FOREIGN PATENT DOCUMENTS

| | | |
|---|---|---|
| CN | 101276746 | 10/2008 |
| JP | 2007-073840 | 3/2007 |

OTHER PUBLICATIONS

S. Wolf and R.N. Tauber, Silicon Processing for the VLSI Era, vol. 1, Lattice Press, ISBN 0-9616721-6-1, year 2000, p. 676.*
B.E.E. Kastenmeier et al., J. Vac. Sci. Technol. A, vol. 17, year 1999, pp. 3179-3184.*

* cited by examiner

*Primary Examiner* — Jiong-Ping Lu
(74) *Attorney, Agent, or Firm* — IPUSA, PLLC (57) ABSTRACT

A plasma processing method for processing a silicon containing film formed on a substrate including a step of removing a reaction product with a first plasma formed from a first gas containing halogen, hydrogen, and carbon in a case where the reaction product is formed when performing an etching process on the silicon containing film by using an etching mask having an etching pattern.

11 Claims, 5 Drawing Sheets

PLASMA PROCESSING METHOD

BACKGROUND OF THE INVENTION

1. Field of the Invention

The present invention generally relates to a plasma processing method.

2. Description of the Related Art

In a process of manufacturing a semiconductor device, fine patterns are formed on a substrate (e.g., semiconductor wafer) by using a plasma etching process. In a case of using the plasma etching process, a target etching material provided on the substrate and a reaction gas used for plasma etching cause a reaction, and a reaction product may accumulate mainly at a sidewall part of an etched pattern.

The reaction product may serve as a protection film that prevents the sidewall part of the etched pattern from being etched during the plasma etching process. On the other hand, if a subsequent process for forming a CVD (Chemical Vapor Deposition) film, a wiring or the like is performed in a state where the reaction product is left remaining, the remaining reaction product may lead to the formation of particles or defective wirings. Therefore, a reaction product that remains mainly at a sidewall part of a pattern is to be removed.

For example, Japanese Laid-Open Patent Publication No. 2007-73840 discloses a technology pertaining to a method for removing a reaction product in which ashing is performed by using oxygen plasma after wet-etching a patterned substrate with a hydrofluoric acid solution and covering an entire surface including an etching surface with an organic material film containing OH or H.

However, by performing a wet-etching process on a substrate by using the hydrofluoric acid solution, not only is the reaction product accumulated mainly at the sidewall part of a pattern is removed by the wet-etching but also an underlayer formed on the substrate is also etched. Therefore, the underlayer may become damaged.

SUMMARY OF THE INVENTION

The present invention may provide a plasma processing method that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a plasma processing method particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a plasma processing method for processing a silicon containing film formed on a substrate including a step of removing a reaction product with a first plasma formed from a first gas containing halogen, hydrogen, and carbon in a case where the reaction product is formed when performing an etching process on the silicon containing film by using an etching mask having an etching pattern.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings. It is to be noted that like components are denoted with like reference numerals throughout the description and drawings and detail description thereof may be omitted.

(Entire Configuration of Plasma Processing Apparatus)

Figure 1:
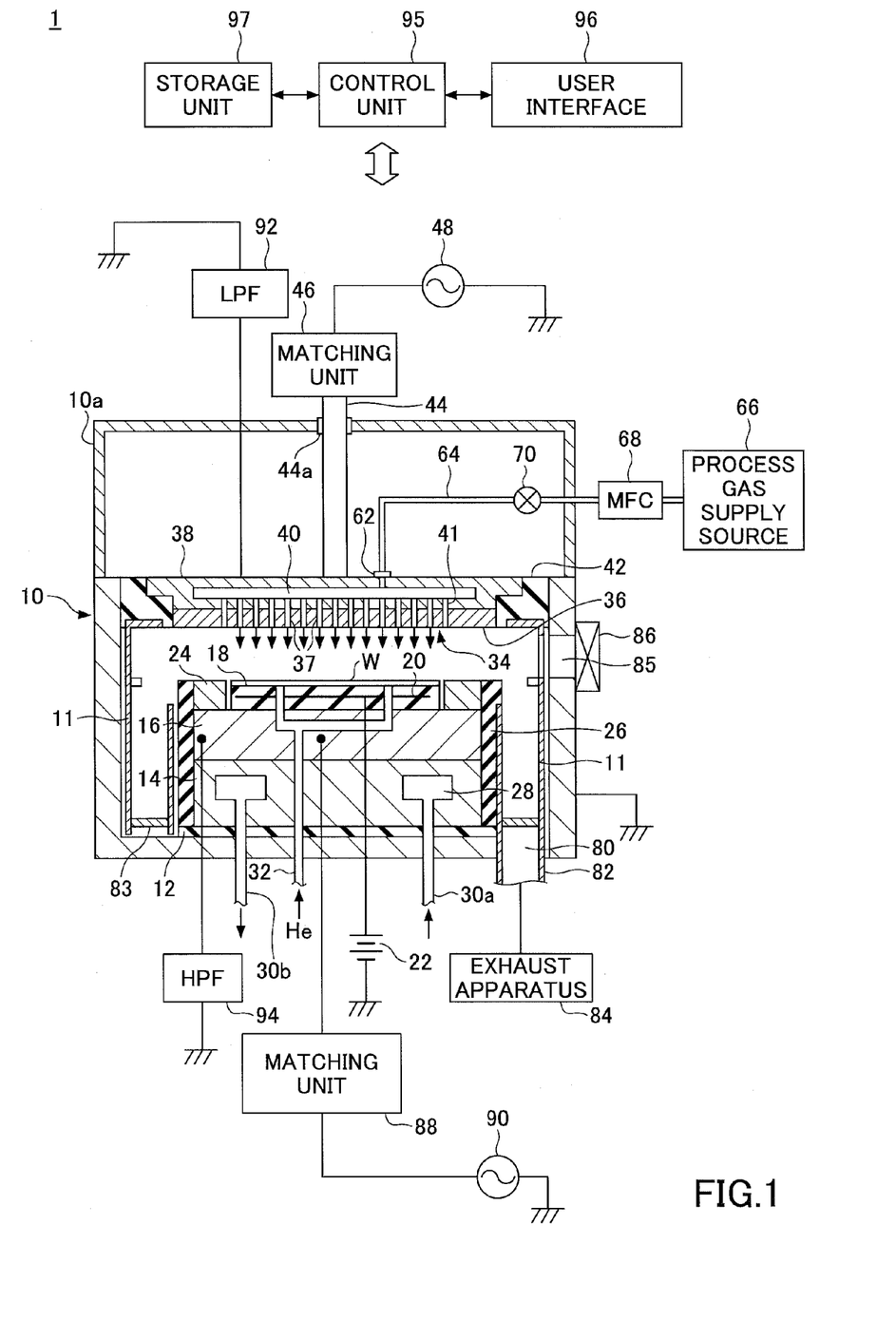
FIG. 1 is a schematic diagram illustrating an entire configuration of a plasma processing apparatus according to an embodiment of the present invention.

First, an entire configuration of a plasma processing apparatus 1 according to an embodiment of the present invention is described with reference to FIG. 1. A flat capacitively coupled plasma (CCP) type plasma processing apparatus is described as an example of the plasma processing apparatus 1. The chamber 10 is protectively grounded.

A columnar susceptor support pedestal 14 is provided on a bottom part of the chamber 10 interposed by an insulation plate 12 formed of ceramic or the like. A susceptor 16 formed of aluminum or the like is provided on the susceptor support pedestal 14. The susceptor 16 also serves as a lower electrode. A semiconductor wafer (target process substrate) W is provided on the susceptor 16.

An electrostatic chuck 18 for electrostatically attracting the semiconductor wafer W is provided on an upper surface of the susceptor 16. The electrostatic chuck 18 includes a structure in which an electrode 20 including a conductive film has a pair of insulating layers or insulating sheets provided therebetween. The direct current power source 22 is electrically connected to the electrode 22. The semiconductor wafer W is attracted and retained on the electrostatic chuck 18 by electrostatic force (e.g. Coulumb's force) generated by the direct current from the direct current power source 22.

A focus ring 24 is formed encompassing the electrostatic chuck 18 (semiconductor wafer W) on an upper surface of the susceptor 16. The focus ring has a conductive property and is formed of, for example, silicon. An inner wall member 26 having a substantially cylindrical shape if formed on the susceptor 16 and the susceptor support pedestal 14.

A cooling chamber 28 may be provided, for example, inside the susceptor support pedestal 14 along the periphery of the susceptor support pedestal 14. A coolant (e.g., cooling water) of a predetermined temperature may be supplied to circulate in the cooling chamber 28 by way of pipes 30a, 30b from an external chiller unit (not illustrated), so that the processing temperature of the semiconductor wafer W provided on the susceptor 16 can be controlled by the coolant.

Further, a transmission gas (e.g., helium (He) gas) from a gas transmission supply mechanism is supplied between the upper surface of the electrostatic chuck 18 and a rear surface of the semiconductor wafer W.

An upper electrode 34 is provided above the susceptor 16 in a position parallel to and facing the susceptor 16. A space between the upper electrode 34 and the susceptor 16 serves as a plasma generation space. The upper electrode 34 faces the semiconductor wafer W provided on the susceptor 16 to form a surface that contacts the plasma generation space. That is, the upper electrode 34 forms a facing surface that faces the plasma generation space.

The upper electrode 34 is supported by an upper part of the chamber by way of an insulating cover member 42. The upper electrode 34 includes an electrode plate 36 and an electrode support body 38. The electrode plate 36 constitutes the facing surface relative to the susceptor 16 and includes multiple gas ejection holes 37. The electrode support body 38 for supporting the electrode plate 36 is detachably attached thereto. The electrode support body 38 is formed of a conductive material. For example, the electrode support body 38 includes a water cooling structure having its surface formed of an anodic oxidized aluminum.

A gas diffusion chamber 40 is provided inside the electrode support body 38. Multiple gas flow holes 41 that communicate with the gas ejection holes 37 extend from the gas diffusion chamber 40. A gas inlet 62 for guiding gas to the gas diffusion chamber 40 is provided in the electrode support body 38. A gas supply pipe 64 is connected to the gas inlet 62, and a gas supply source 66 is connected to the gas supply pipe 64.

A MFC (Mass Flow Controller) 68 and an open/close valve 70 are arranged in the gas supply pipe 64 from its upstream side in this order. An etching gas from the gas supply source 66 is supplied from the gas supply pipe 64 to the gas diffusion chamber 40. Upon reaching the diffusion chamber 40, the etching gas is ejected in a shower-like manner in the plasma generation space. That is, the upper electrode 34 functions as a shower head for supplying gas.

The upper electrode 34 is electrically connected to a first high frequency power supply 48 via a first matching unit 46 and a power supply rod 44. The first high frequency power supply 48 outputs a high frequency power of, for example, 60 MHz, for generating plasma.

The first matching unit 46 is for matching a load impedance with respect to an internal or (output) impedance of the first high frequency power supply 48. That is, the first matching unit 46 functions to superficially match the output impedance of the first high frequency power supply 48 and the load impedance at the time of generating plasma inside the chamber 10. An output terminal of the first matching unit 46 is connected to an upper end of the power supply rod 44.

A ground conductor 10a having a substantially cylindrical shape provided in a manner extending upward from a sidewall of the chamber 10 to a level higher than the upper electrode 34. A ceiling part of the ground conductor 10a is electrically insulated from the power supply rod 44 by a cylindrical insulating member 44a.

A second high frequency power supply 90 is electrically connected to the susceptor 16 via a second matching unit 88. The second high frequency power supply 90 outputs a frequency power for ion-attraction ranging from 300 kHz-13.56 MHz. For example, the second high frequency power supply 90 outputs a high frequency power of, for example, 13.56 MHz. By supplying high frequency power from the second high frequency power supply 90 to the susceptor 16, ions can be attracted (biased) toward the semiconductor wafer W.

The second matching unit 88 is for matching a load impedance with the with respect to an internal or (output) impedance of the second high frequency power supply 90. That is, the second matching unit 88 functions to superficially match the internal impedance of the second high frequency power supply 90 and the load impedance at the time of generating plasma inside the chamber 10.

An LPF (Low Pass Filter) 92 is electrically connected to the upper electrode 34 for allowing the high frequency power from the second high frequency power supply 90 to pass to the ground and preventing the high frequency power from the first high frequency power supply 48 passing therethrough.

The LPF 92 is preferred to be an LR filter or a LC filter. However, the LPF 92 may be a single lead wire because a sufficient reactance can be provided to the high frequency power from the first high frequency power source 48.

An exhaust port 80 is provided at a bottom part of the chamber 10. An exhaust apparatus 84 is connected to the exhaust port 80 via an exhaust pipe 82. The exhaust apparatus 84 includes a vacuum pump (e.g., turbomolecular pump) and is capable of reducing the pressure inside the chamber 10 to a desired vacuum pressure.

Further, a conveying port 85 for conveying in/out the semiconductor wafer W is provided in a sidewall of the chamber 10. The conveying port 85 can be opened and closed by a gate valve 86.

A depo-shield 11 for preventing etching sediments (deposits) from adhering to the chamber 10 is detachably attached to the chamber 10 along an inner wall of the chamber 10. That is, the depo-shield 11 constitutes a chamber wall of the chamber 10. The depo-shield 11 is also provided along an outer periphery of the inner wall member 26.

An exhaust plate 83 is provided between the depo-shield 11 on the side of the chamber sidewall and the depo-shield 11 on the side of the inner wall member 26 at the bottom part of the chamber 10. An aluminum covered by a ceramic material (e.g., yttria ($Y_2O_3$)) may preferably be used as the depo-shield 11 and the exhaust plate 83.

The components and parts that constitute the plasma processing apparatus 1 is connected to and controlled by a control unit 95. The control unit 95 is connected to a user interface 96 including a keyboard for inputting controls for managing the plasma processing apparatus and a display for visualizing an operation status of the plasma processing apparatus 1.

Further, the control unit 95 is also connected to a storage unit 97 that stores, for example, a control program for implementing each of the processes performed by the plasma processing apparatus 1 and a program for executing the processing performed by the components and parts of the plasma processing apparatus 1 in accordance with a processing condition(s). In other words, the control unit 95 is connected to the storage unit 97 having a recipe stored therein.

The recipe may be stored in, for example, a hard disk, a semiconductor memory, or the like. Alternatively, the recipe may be recorded in a recording medium (e.g., CD-ROM, DVD) that can be read by a portable computer, so that the recipe can be set in a predetermined location of the storage unit 97.

According to necessity, the recipe can be retrieved from the storage unit 97 in response to, for example, an instruction from the user interface 96 and executed by the control unit 95. Thereby, a desired process can be performed by the plasma processing apparatus 1 under the controls of the control unit 95. The plasma processing apparatus 1 of this embodiment includes the control unit 95.

The below-described plasma process (see FIG. 2) is performed by the plasma processing apparatus 1.

In performing the plasma process, first, the gate valve 86 is opened. Then, the semiconductor wafer (target etching substrate) W is conveyed into the chamber 10 through the conveying port 85 and placed on the susceptor 16. Then, the gas and high frequency power is supplied into the chamber 10 in accordance with the controls of the control part 95, to thereby generate a desired plasma. Thus, a desired plasma process is performed by using the generated plasma, and a desired pattern is formed on the semiconductor wafer W.

(Plasma Process Method)

Next, an embodiment of a plasma process method using the plasma processing apparatus 1 is described with reference to FIGS. 2-5.

Figure 2:
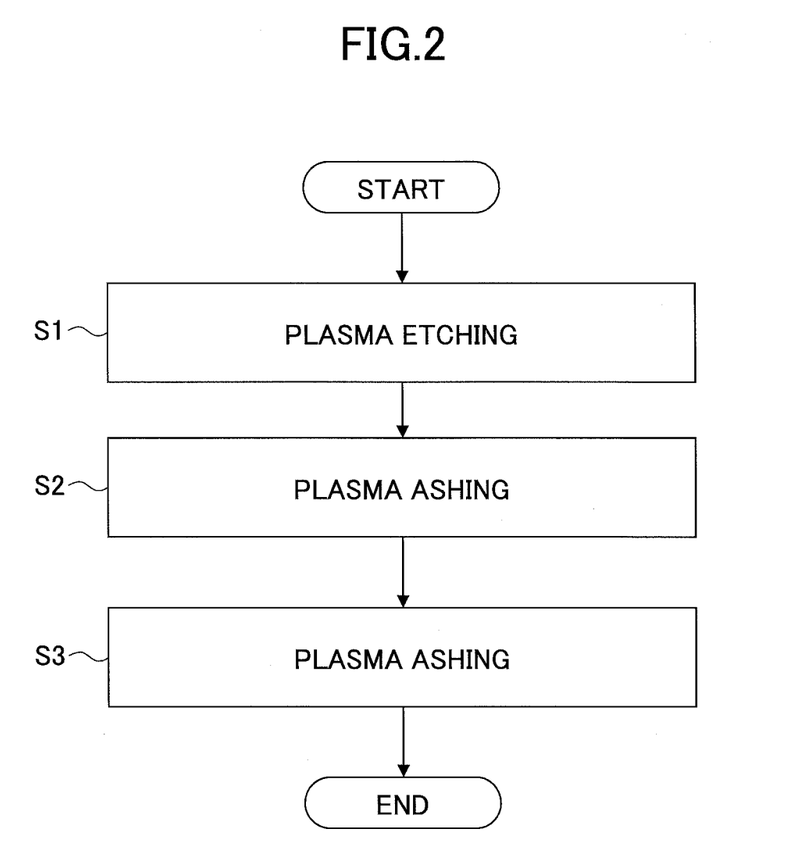
FIG. 2 is a flowchart of a plasma processing method according to an embodiment of the present invention.

FIG. 2 is a flowchart of a plasma processing method according to an embodiment of the present invention.

As illustrated in FIG. 2, the plasma processing method of this method is a method for processing a silicon containing film by using an etching mask having an etching pattern formed thereon. The plasma processing method includes an etching step (S1), a removing step (S2), and an after-treatment step (S3).

Step S1 is a step of etching a silicon containing film with plasma generated by a second gas containing halogen.

Step S2 is a step of removing a reaction product generated during the etching of Step S1 with a plasma generated by a first gas containing halogen, hydrogen ($H_2$), and carbon (C).

Step S3 is a step of removing the etching mask by a plasma generated by a third gas containing oxygen ($O_2$).

Figure 3A:
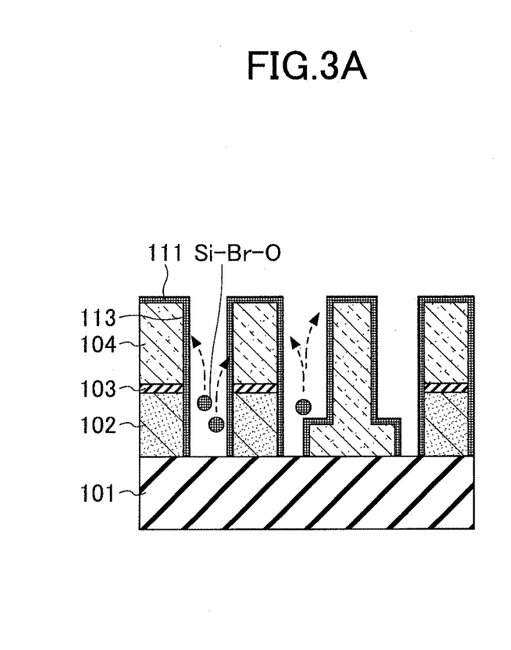
FIGS. 3A-3C are schematic diagrams illustrating cross sections of a silicon containing film in each step illustrated in FIG. 2.

This embodiment is described with an example where a TEOS (TetraEthOxySilane) film 101, a polysilicon film 102, a silicon oxide film 103, and an amorphous carbon film 104 are formed on the semiconductor wafer W.

The polysilicon film 102 is an example of the silicon containing film. The amorphous carbon film 104 is an example of the etching mask having an etching pattern formed thereon beforehand.

Further, a mixed gas containing hydrogen bromide (HBr), He, and $O_2$ is used as the second gas for etching the polysilicon film 102. Further, a mixed gas containing tetrafluoromethane ($CF_4$) and $H_2$ are used as the first gas for removing the reaction product. Further, an $O_2$ gas is used as the gas for removing the amorphous carbon film 104.

Next, the steps S1-S3 are described in order.

<Etching Step S1 for Etching Silicon Containing Film>

In Step S1, a silicon containing film (polysilicon film 102) is etched to form a desired pattern thereon.

First, a mixed gas containing HBr, He, $O_2$ from the gas supply source 66 is applied to the semiconductor wafer W placed on the susceptor 16. In this case, the flow ratio of the mixed gas containing HBr, He, $O_2$ is HBr/He/$O_2$=400-600/350-530/7-11 sccm.

Then, a first high frequency power (for plasma generation) of 60 MHz is supplied from the first high frequency power supply 48. A second high frequency power (for ion-attraction) of 13.56 MHz is supplied from the second high frequency power supply 90.

As illustrated in FIG. 3A, the polysilicon film 102 is etched to form a pattern of the amorphous carbon film 104 thereon. At the same time of etching the polysilicon film 102, a reaction product of a SiBrO film 111 accumulates in a sidewall part of the pattern (sidewall parts of the polysilicon film 102, the silicon oxide film 103, and the amorphous carbon film 104) and an upper part of the amorphous carbon film 104.

The SiBrO film 111 formed in the sidewall part 113 of the pattern prevents the sidewall part 113 of the pattern from being excessively etched. Thereby, the degree of etching in the depth direction can be selectively controlled.

Because HBr gas is mainly used in this etching step, the etching is mainly conducted by a chemical reaction and plasma is generated from the second gas containing no carbon, a protection film 112 formed by carbon-carbon bonding would not be formed at the surfaces of the sidewall part 113 of the pattern and polysilicon film 102.

Therefore, in Step S1, the polysilicon film 102 can be etched with a high aspect ratio.

One of ordinary skill in the art may arbitrarily select the type of reaction gas and silicon containing film according to a process conditions for performing the etching step of S1 (e.g., pressure, frequency/power of high frequency power, gas flow amount/process time).

<Removing Step S2 for Removing Reaction Product>

Figure 3B:
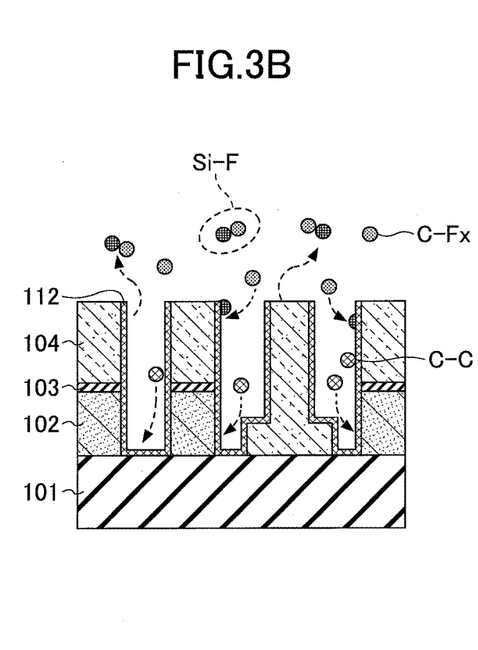

In step S2, removal of the reaction product (SiBrO film 111) accumulated in the sidewall part 113 of the pattern is performed on the etched polysilicon film 102 having the pattern formed thereon in step S1.

First, a mixed gas containing $CF_4$ and $H_2$ is supplied from the gas supply source 66. In this case, the flow ratio of the mixed gas containing $CF_4$ and $H_2$ is $CF_4/H_2$=80-120/160-240 sccm.

Then, a high frequency power of 60 MHz is supplied from the first high frequency power supply 48. As illustrated in FIG. 3B, the SiBrO film 111 accumulated in the sidewall part 113 of the pattern is removed without etching the TEOS film 101 or the polysilicon film 102.

The process of Step S2 is performed under the conditions where no high frequency power is supplied by stopping the supplying of the second high frequency power (for ion-attraction) from the second high frequency power supply 90 to the susceptor 16. Thereby, the TEOS film 101 and the polysilicon film 102 formed on the semiconductor wafer W can be prevented from being damaged by ions because the accelerated voltage of the ions in the plasma can be reduced by stopping the supply of high frequency power.

Next, the effects of step S2 and the mechanism of the plasma process are described.

Typically, in a case where etching is performed on a substrate with plasma generated from a halogen containing gas, a protection film accumulates at a sidewall part. Thereby, the sidewall part is prevented from being etched, and the etching advances mainly in the depth direction. The protection film of the sidewall part can be removed by performing wet-etching using hydrofluoric acid solution.

However, when such wet-etching using the hydrofluoric acid solution is performed on a substrate, not only is the reaction product accumulated in the sidewall part is removed but also the underlayer may also be etched. Thus, the underlayer could be damaged. Because the process of etching the silicon containing film of step S1 and the removal of the reaction product are performed with separate apparatuses, the throughput decreases whereas the manufacturing cost of the plasma processing apparatuses increases.

On the other hand, with the plasma processing method of this embodiment, the SiBrO film 111 generated during the etching of the polysilicon film 102 is removed by a plasma formed of a first gas containing halogen, hydrogen, and carbon.

In Step S2, owing to the below-described chemical reaction caused between the SiBrO film 111 and the plasma formed of the first gas, the SiBrO film 111 generated during the etching of the polysilicon film 102 can be removed while protecting the TEOS film 101.

Figure 4:
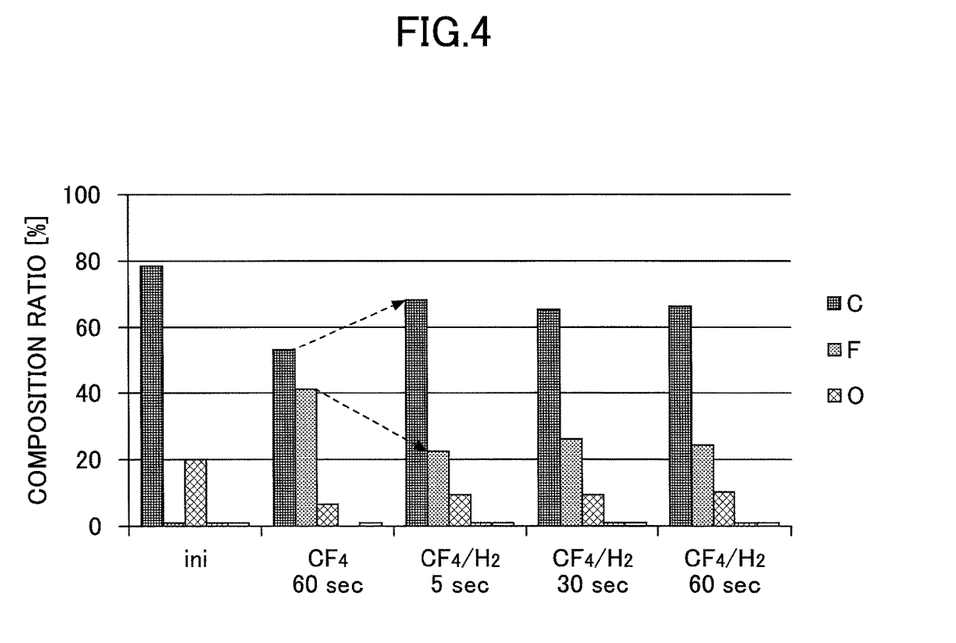
FIG. 4 is a graph illustrating a composition of a deposited material according to an embodiment of the present invention.

FIG. 4 illustrates the analysis results using XPS (X-ray Photoelectron Spectroscopy) in which a case of analyzing sediments (deposits) accumulated on a PR (Photo Resist) after performing a plasma process on the PR by using a plasma formed of $CF_4$ gas or a mixed gas of $CF_4$ and $H_2$.

As illustrated in FIG. 4, in a case where a plasma process is performed on a PR by using a plasma formed of a mixed gas containing $CF_4$ and $H_2$, the proportion of carbon (C) contained in the sediments is greater than the proportion of F compared to a case of performing a plasma process on a PR by using a plasma formed only of a $CF_4$ gas.

That is, the following chemical reaction formula (1) of the mixed gas containing $CF_4$ and $H_2$ (first gas) occurs in the plasma by electron-impact dissociation.

$$CF_4H_2 \rightarrow C\text{---}C + CFx + CH + H \quad (1)$$

The following chemical reaction formulas (2) and (3) occur in the atoms and the molecules of $CF_4$ and $H_2$ of the plasmas of the above-described chemical reaction with respect to a reaction product.

$$H: H + SiBrO \rightarrow SiBr + OH \quad (2)$$

$$CF_x: SiBr + CF_x \rightarrow SiF\uparrow + C + Br \quad (3)$$

That is, the SiBrO film 111 accumulated in the sidewall part 113 of the pattern is deoxidized by an H radical as illustrated in the chemical reaction formula (2). Thereby, silicon bromide (SiBr) is generated. By the chemical reaction of SiBr and an $CF_x$ radical as illustrated in the chemical formula (3), the SiBr detaches from the sidewall part 113 of the pattern and is discharged from the chamber 10 in the form of a volatile SiF gas as illustrated in FIG. 3B.

That is, the surface of the TEOS film and the surface of the polysilicon film 102 are hardly etched by the $CF_x$ radical owing to the protection film 112 including the carbon bonding (C—C) accumulated after the removal of the SiBrO film 111.

Figure 5A:
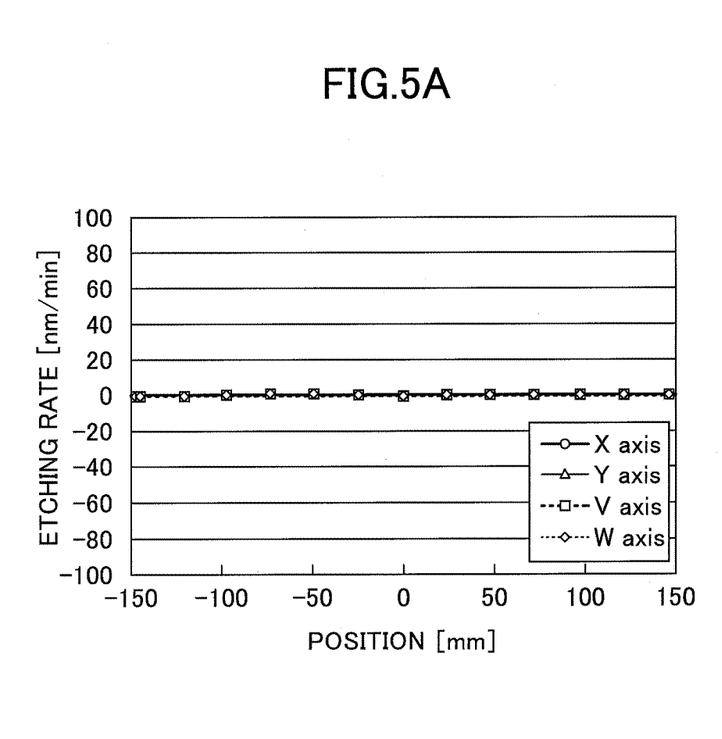
FIGS. 5A and 5B are graphs illustrating etching rates of TEOS and poly-silicon according to an embodiment of the present invention.
Figure 5B:
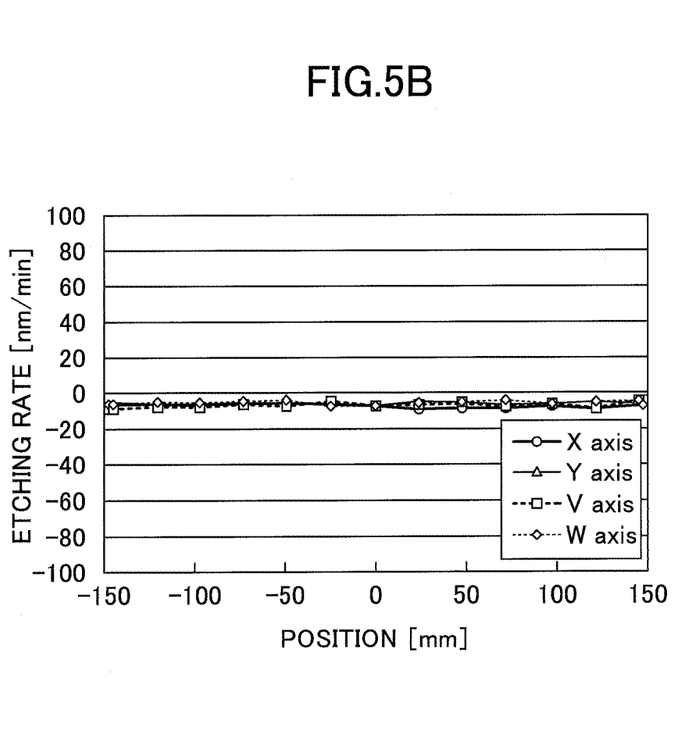

FIG. 5A illustrates an etching rate in a case of performing a plasma process on a substrate having the TEOS film 101 formed thereon by using a plasma generated from a mixed gas of $CF_4$ and $H_2$. FIG. 5B illustrates an etching rate in a case of performing a plasma process on a substrate having the polysilicon film 102 formed thereon by using a plasma generated from a mixed gas of $CF_4$ and $H_2$. In FIGS. 5A and 5B, the horizontal axis indicates the positions of a substrate, and the vertical axis indicates the etching rates of the TEOS film 101 and the polysilicon film 102, respectively.

In the explanatory notes in FIGS. 5A and 5B, X axis, Y axis, V axis, and W axis indicate an arbitrarily selected radial direction of the semiconductor wafer W, respectively.

As illustrated in FIGS. 5A and 5B, the TEOS film 101 and the polysilicon film 102 are hardly etched by the plasma generated from a mixed gas of $CF_4$ and $H_2$ regardless of the direction relative to the substrate.

Accordingly, in the removing step S2 for removing the reaction product, the reaction product (SiBrO film 111) generated during the etching of the silicon containing film (polysilicon film 102) can be removed while protecting the underlayer (TEOS film 101). Further, because the step of etching the silicon containing film and the step of removing the reaction product can be performed with a single apparatus, the throughput can be improved and the manufacturing cost of the plasma processing apparatus can be reduced.

<Removing Step S3 for Removing Etching Mask>

Figure 3C:
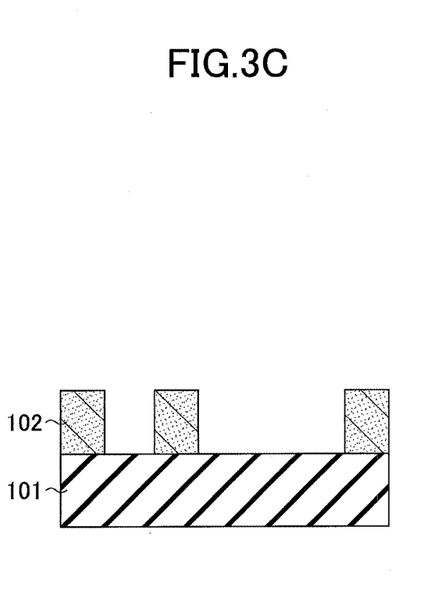

In Step S3, the etching mask amorphous carbon film 104) and the protection film 112 containing the carbon bonding are removed with a plasma generated from a third gas containing oxygen ($O_2$).

First, in $O_2$ gas from the gas supply source 66 is supplied to the polysilicon film 102 having the SiBrO film 111 removed therefrom. In supplying the $O_2$ gas, the flow amount of the O2 gas is preferably 280-420 sccm.

Then, a high frequency power of 60 MHz is supplied from the first high frequency power supply 48, and a high frequency power of 13.56 MHz is supplied from the second high frequency power supply 90. As illustrated in FIG. 3C, the silicon oxide film 103, the amorphous carbon film 104, and the protection film 112 are removed. Thereby, the polysilicon film 102 having a desired pattern is formed.

Further, the present invention is not limited to these embodiments, but variations and modifications may be made without departing from the scope of the present invention.

For example, the etching gas used in Step S1 for etching the silicon containing film is not limited to the above-described mixed gas containing HBr, He, and $O_2$. That is, other gases may be used for etching the silicon containing film as long as they contain halogen. As for examples of the halogen containing gas, there are $CF_4$ gas, $SF_6$ gas, NF3 gas, and chlorine ($Cl_2$) gas.

By using the halogen containing gas as the gas for etching the silicon containing film, the target etching material can be removed in the form of a volatile high halogen compound.

In a case where $Cl_2$ is used as the halogen containing gas, although SiClO is generated as the reaction product instead of SiBrO, the $Cl_2$ is removed in the same manner as the above-described embodiment.

The process gas used in Step S2 for removing the reaction product is not limited to the above-described mixed gas containing $CF_4$ and $H_2$. That is, other gases may be used for removing the reaction product as long as they contain halogen, hydrogen, and carbon. A mixed gas containing fluorocarbon gas and hydrogen or a mixed gas containing hydro-fluorocarbon gas and hydrogen is preferred to be used for removing the reaction product. More preferably, the fluorocarbon gas and the hydro-fluorocarbon gas of the mixed gas at least one of $CF_4$, $CH_2F_2$, and $CH_3F$.

The unit for generating the plasma according to an embodiment of the present invention may be, for example, a CCP (Capacitively Coupled Plasma) generating unit, a ICP (Inductively Coupled Plasma) generating unit, a HWP (Helicon Wave Plasma) generating unit, a microwave excitation surface plasma generating unit that generates a microwave plasma generated by a RLSA (Radial Line Slot Antenna) or Slot Plane Antenna), a ECR (Electron Cyclotron Resonance Plasma) generating unit, or a remote plasma generating unit that uses the aforementioned plasma generating units.

Further, the substrate is not limited to the semiconductor wafer W. Alternatively, the substrate may be a large-sized substrate used for a flat panel display or a substrate for a solar battery.

The present application is based on and claims the benefit of priority of Japanese Priority Application No. 2013-214780 filed on Oct. 15, 2013, with the Japanese Patent Office, the entire contents of which are hereby incorporated by reference.

What is claimed is:

1. A plasma processing method for processing a silicon containing film formed on a substrate, comprising a step of:

removing a halogen-modified silicon oxide and forming a protection layer containing carbon with a first plasma formed from a first gas containing halogen, hydrogen, and carbon in a case where the halogen-modified silicon oxide is formed when performing an etching process on the silicon containing film by using an etching mask having an etching pattern, said removing and etching processes being performed in a same chamber, said protection layer containing a carbon bonding, said first gas containing $CF_4$ and $H_2$ with a flow ratio of $CF_4/H_2$=80-120/160-240 sccm, removing the etching mask and the protection layer with a third plasma formed from a third gas containing oxygen after the removing of the halogen-modified silicon oxide and forming the protection layer, the third gas containing the oxygen having a flow rate of 280-420 sccm, and wherein the etching process includes supplying a power for ion-attraction to a susceptor on which the substrate is placed, and wherein the supplying of the power is stopped during the removing of the halogen-modified silicon oxide.

2. The plasma processing method as claimed in claim 1, further comprising a step of:

performing the etching process with a second plasma formed from a second gas containing halogen.

3. The plasma processing method as claimed in claim 2, wherein the second gas is a gas that contains no carbon.

4. The plasma processing method as claimed in claim 1, wherein the first gas is a gas formed of fluorocarbon gas and hydrogen or a gas formed of hydro-fluorocarbon gas and hydrogen.

5. The plasma processing method as claimed in claim 4, wherein the fluorocarbon gas and the hydro-fluorocarbon include at least one of $CF_4$, $CH_2F_2$, and $CH_3F$.

6. The plasma processing method as claimed in claim 4, wherein a flow ratio of $CF_4$ and $H_2$ is within a range of 1:3 to 3:4.

7. The plasma processing method as claimed in claim 1, wherein the silicon containing film is polysilicon.

8. The plasma processing method as claimed in claim 1, wherein the removing and etching processes are performed by a capacitively coupled plasma type plasma processing apparatus having lower and upper electrodes.

9. The plasma processing method as claimed in claim 1, the removing process has a selectivity to the silicon oxide film and the polysilicon film.

10. The plasma processing method as claimed in claim 1, wherein the halogen-modified silicon oxide is formed on a surface at a lateral wall of the silicon containing film when being etched in a predetermined pattern.

11. The plasma processing method as claimed in claim 1, wherein the protection layer is formed on surfaces at a lateral wall and a bottom wall of the silicon containing film when being etched in a predetermined pattern.

* * * * *